United States Patent [19]
Diba et al.

[11] Patent Number: 5,670,896
[45] Date of Patent: Sep. 23, 1997

[54] HIGH SPEED PRODUCT TERM ASSIGNMENT FOR OUTPUT ENABLE, CLOCK, INVERSION AND SET/RESET IN A PROGRAMMABLE LOGIC DEVICE

[75] Inventors: Sholeh Diba, Los Gatos; Wei-Yi Ku, San Jose, both of Calif.

[73] Assignee: Xilinx, Inc., San Jose, Calif.

[21] Appl. No.: 533,890

[22] Filed: Sep. 26, 1995

[51] Int. Cl.$^6$ .................. H03K 7/38; H03K 19/173
[52] U.S. Cl. ............................ 326/40; 326/39
[58] Field of Search ............................ 326/39, 40

[56] References Cited

U.S. PATENT DOCUMENTS

| | | | |
|---|---|---|---|
| 4,903,223 | 2/1990 | Norman et al. | 326/39 |
| 5,191,243 | 3/1993 | Shen et al. | 326/39 |
| 5,300,830 | 4/1994 | Hawes | 326/39 |
| 5,357,153 | 10/1994 | Chiang et al. | 326/39 |
| 5,450,021 | 9/1995 | Chiang | 326/39 |
| 5,450,608 | 9/1995 | Steele | 326/39 |

*Primary Examiner*—Edward P. Westin
*Assistant Examiner*—Richard Roseen
*Attorney, Agent, or Firm*—Skjerven, Morrill, MacPherson, Franklin & Friel; Jeanette S. Harms

[57] ABSTRACT

A macrocell for a programmable logic device includes private product term assignments to provide various functions including set and reset, output enable, clocking, and inversion. Each of these additional functions is provided by assigning one of the product terms associated with the macrocell to perform one of these functions locally. By means of additional logic circuitry these functions are achieved either singly or in combination for a particular macrocell, thus improving macrocell flexibility and in some cases conserving pins of the chip of which the programmable logic array is a part.

12 Claims, 4 Drawing Sheets

| R | S | Q output |
|---|---|----------|
| 0 | 0 | Same |
| 0 | 1 | Set to 1 |
| 1 | 0 | Reset to 0 |
| 1 | 1 | Set to 1 |

HIGH SPEED PRODUCT TERM ASSIGNMENT FOR OUTPUT ENABLE, CLOCK, INVERSION AND SET/RESET IN A PROGRAMMABLE LOGIC DEVICE

BACKGROUND OF THE INVENTION

1. Field of the Invention

This invention relates to programmable logic devices and more specifically to product term assignments in the macrocells of a programmable logic array.

2. Description of the Related Art

Programmable logic devices are well known in the art. Typically programmable logic devices include a number of macrocells each having essentially identical structure which includes, for example, a D type flip-flop. The input signals to the data input terminal of the flip-flop are provided from an AND array of the programmable logic device the output signals of which are logically OR'ed together. See for instance copending and commonly owned U.S. patent application Ser. No. 08/533,889, filed Sep. 26, 1995, entitled "Macrocell Architecture with High Speed Product Terms" having the same inventors as the present application (attorney docket no. M-3200 US) and incorporated herein by reference.

A typical prior art portion of a macrocell for a programmable logic device is shown in FIG. 1. This macrocell portion includes a D type flip-flop 10 having a D data input terminal, a Q data output terminal, a clock terminal, and a set/reset (S/R) terminal. The signal on the Q data output terminal drives an output buffer inverter 14 which is enabled by an output enable signal (OE). The output signal of the output buffer 14 drives a pin of the programmable logic device chip. Note that the interconnection between the output buffer 14 and the pin itself is conventional and therefore is not explained in detail herein. In this case, driving the D data input terminal of flip-flop 10 is a NOR gate 16 having four input terminals which receive four product terms of the particular macrocell. Flip-flop 10 receives via the flip-flop's set or reset terminal a fifth product term. The fifth product term is used exclusively for the set or reset function. Thus, only four product terms are used as actual data input signals, and the only so-called private product term in this macrocell is the single fifth product term used for setting or resetting flip-flop 10. This configuration provides only limited flexibility.

FIG. 2 shows output buffer 14 (FIG. 1) in greater detail, the Q data output terminal of flip-flop 10, and the output enable (OE) line. The single output enable (OE) line shown in FIG. 1 actually includes two output enable lines OE1 and OE2 connected to buffer 14 through pass transistors 20 and 22 respectively, wherein the gate of each pass transistor is connected to a configuration bit CB. The Select signal, if enabling (high), allows either of signals OE1 or OE2 to control output buffer 14. If the Select signal is non-enabling (low), then output buffer 14 is in a PAL (programmable array logic) mode and therefor is controlled by signal Q.

Output enable signals OE1, OE2 are typically global signals provided from a chip input terminal (pin). "Global" means the identical signal(s) go to each macrocell. Thus, signals OE1 and OE2 are the same for all macrocells in the chip. Therefore, conventional buffer 14 undesirably requires the use of two of the relatively few input pins of the chip for output enable signals OE1, OE2.

FIG. 3 illustrates the input signal circuitry coupled to the clock terminal of flip-flop 10. Two clock lines, global clock 1 and global clock 2, are connected to the input terminals of a multiplexer 32. Depending on the signal provided to the control terminal, multiplexer 32 provides one or two global clock signals to the clock terminal of flip-flop 10. Thus, in the prior art, there is no internal (macrocell) clock signal; there are only two global clock signals which are provided from chip pins (similarly to the output enable signals described above). Therefore the prior art further wastes valuable chip pins and prevents internal assignment of a clock signal for a particular macrocell.

FIG. 4 shows the provision of the four product term data signals to the data input terminal D of flip-flop 10 by use of NOR gate 36, which has four product terms provided as inputs thereto. The remaining fifth product term of the macrocell hence is not available to the D input terminal, but is dedicated to other uses (i.e., reset) as shown for instance in FIG. 1. Again there is less flexibility than is desired.

SUMMARY OF THE INVENTION

A macrocell of a programmable logic array has enhanced flexibility in accordance with various aspects of the present invention. In one aspect the flip-flop has separate set and reset terminals, each terminal selectively receiving a product term or a global input signal by means of configurable pass transistors. Any of the product terms of the macrocell not used to drive the data input terminal may be used therefore for the set or reset, clock, output enable, or inversion control functions. Also, global signals are provided for set and reset of the flip-flop.

In accordance with a second aspect of the present invention, instead of only two output enable signals as provided by the prior art, a third output enable signal (a product term of the macrocell) is selectively provided to an output enable node of the output buffer of the macrocell. Thus, each macrocell has direct control on the pin assigned to that macrocell for purposes of output enable.

In accordance with a third aspect of the present invention, the clock terminal is selectively driven by one of three global clock signals or a product term clock signal. Thus, the present invention provides an internal clock signal (a private product term) for each macrocell. This internally generated clock signal allows the user to clock the flip-flop of that macrocell with a different frequency independent of any other macrocell, thereby significantly increasing circuit flexibility in comparison to prior art circuits.

In accordance with a fourth aspect of the present invention, instead of driving the D data input terminal of the flip-flop in the macrocell by a NOR gate having a plurality of input terminals, an additional logic gate, i.e. an exclusive OR (XOR) gate, receives signals from the NOR gate as well as from one of the product term lines. The output terminal of the XOR gate is connected to the D input terminal of the flip-flop. If the value of the product term is zero, the signal at the D terminal of the flip flop is the value as determined by the NOR gate. On the other hand, if the value of the product term is one, the signal at the D input terminal is the inverse of the signal provided by the NOR gate. Thus, the private product term is used for inversion control of the input signal to the D flip-flop.

BRIEF DESCRIPTION OF THE DRAWINGS

Similar reference numbers used herein in different figures refer to similar or identical structures.

DETAILED DESCRIPTION OF THE DRAWINGS

Figure 5A:
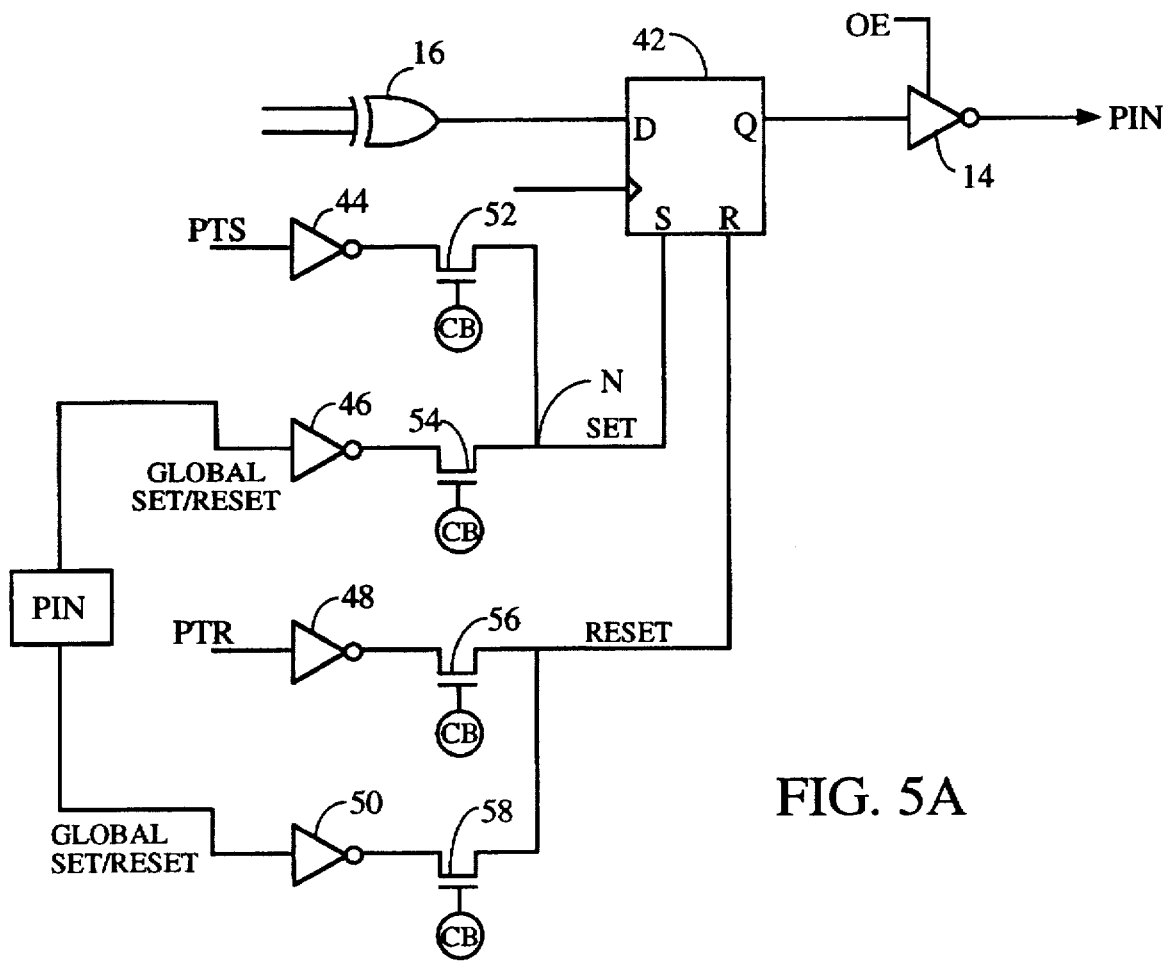
FIG. 5A shows, in accordance with the present invention, a flip-flop having separate set and reset terminals.

In accordance with one embodiment of the present invention shown in FIG. 5A, each macrocell receives five separate product terms. Any one of these product terms, if not used as an input signal to a flip-flop 42 at its D (data) input terminal (via the exclusive OR gate 16), may be used programmably for any one of several purposes described in detail with reference to FIGS. 5A, 6, 7 and 8. Thus, the embodiments in those figures represent various uses of the product terms, wherein some or all uses of those product terms may be used in any one particular macrocell. In FIG. 5A, two of these product terms, labeled pts and ptr, are used for set and reset signals, respectively, of flip-flop 42. In this embodiment, a global set signal and a global reset signal are also provided from a chip pin PIN. Note that once the private set or reset signals are used, this chip pin is freely used as an access pin.

Figure 1:
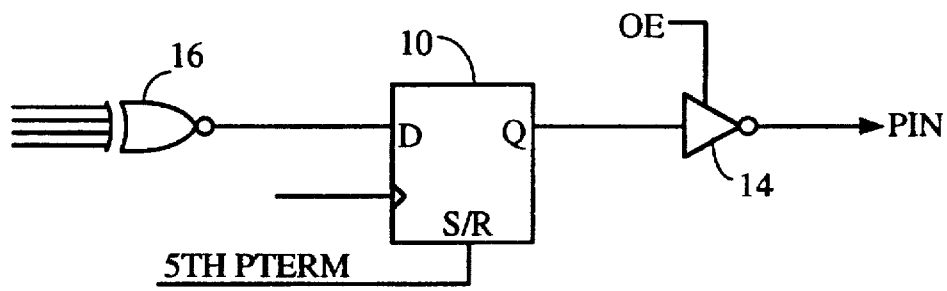
FIG. 1 shows a prior art flip-flop having a single set/reset terminal.

The prior art of FIG. 1 provides only one set/reset terminal, and all macrocells have the same input. In accordance with the invention, each macrocell can be controlled individually and set and reset are controlled independently.

Thus, in accordance with a first aspect of the present invention, FIG. 5A shows a D type flip-flop 42 which includes separate set (S) and reset (R) terminals. The set terminal is driven by either a product term pts via inverter 44 and pass transistor 52, or a global set/reset signal provided via inverter 46 and pass transistor 54. Each of pass transistors 52 and 54 is controlled by a configurable bit CB of the type well known in programmable logic devices. Similarly the reset (R) terminal is driven by either a product term ptr via inverter 48 and pass transistor 56, or a global set/reset signal provided via inverter 50 and pass transistor 58. Again, pass transistors 56 and 58 are each controlled by a configuration bit CB.

Figures 5B, 5C:
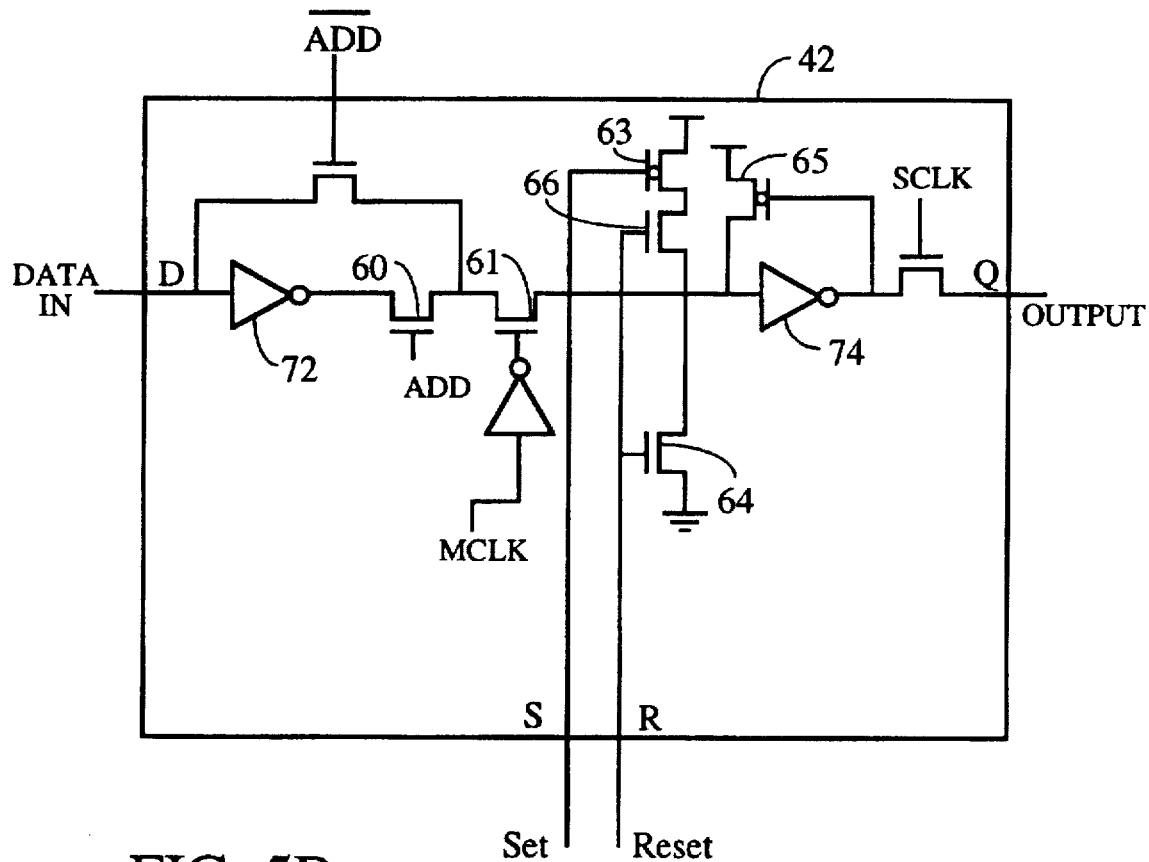
FIG. 5B shows a detailed schematic of the flip-flop of FIG. 5A.
FIG. 5C shows a truth table for the set and reset terminals of the flip-flop of FIG. 5A.configuration in accordance with the present invention.

FIG. 5B shows flip-flop 42 in greater detail. The transistors 60–65 as well as inverters 72 and 74 are conventional and therefore are not explained in detail herein.

In this embodiment, the clock signals are designated MCLK and SCLK. Clock signals MCLK and SCLK are conventionally of opposite polarity to allow clocking data out of flip-flop 42. The ADD signal is the last product term, and provides inversion control. Thus, FIG. 5B shows in effect a combination of an exclusive OR gate and a flip-flop, wherein the ADD signal provides the inversion control or exclusive OR function.

A truth table for the set(s) and reset signals of FIGS. 5A and 5B is shown in FIG. 5C. The truth table shows the output signal at terminal Q and its relationship to the input signal at terminal D. As shown, if either or both the set or reset signals have a value of one, then a particular output signal results. On the other hand, if both the set and reset signals are zero, then the output signal is the same as the input signal if clocking and the same as before if not clocking.

Figure 2:
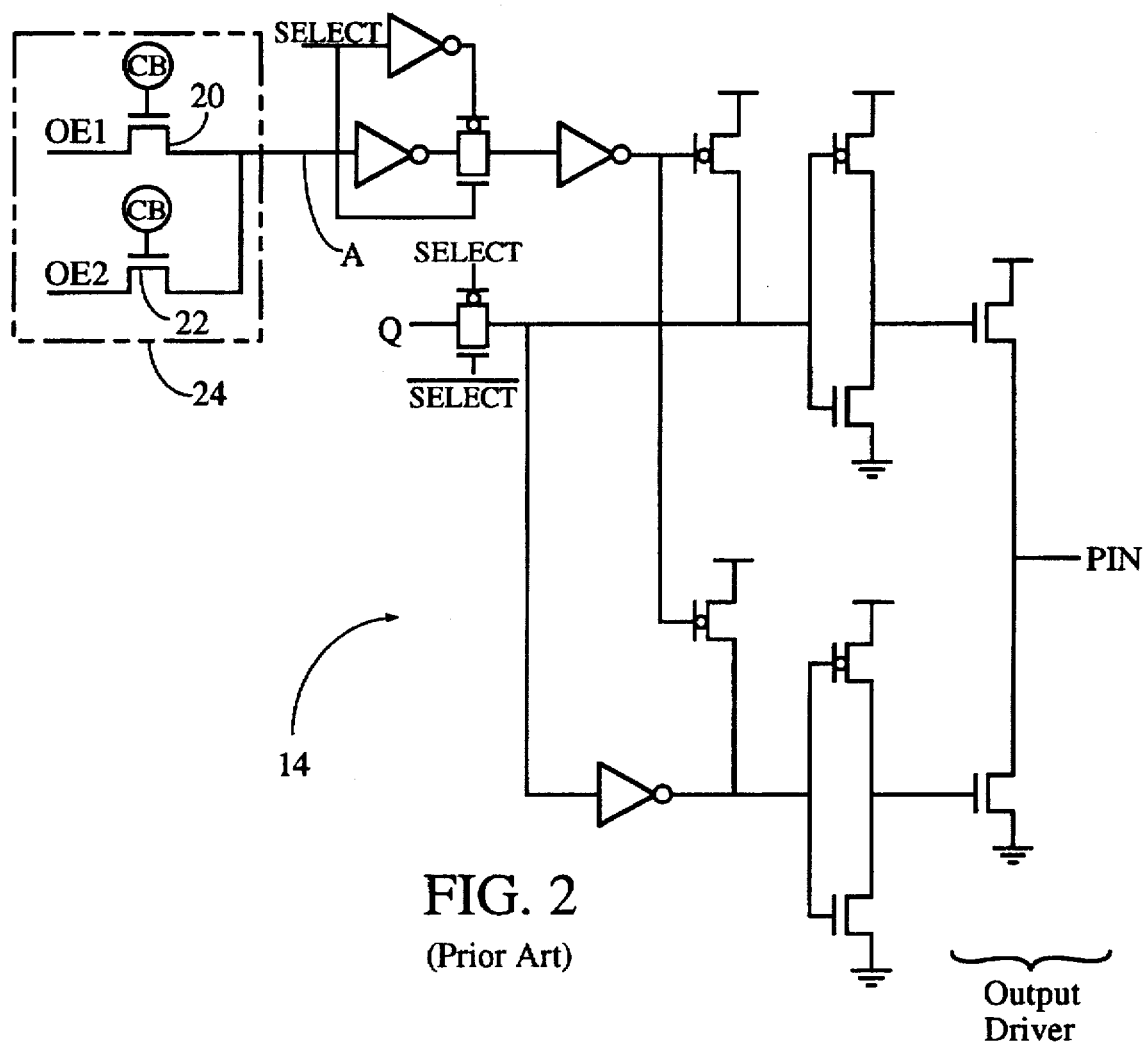
FIG. 2 shows an output buffer and output enable portions thereof of a prior art macrocell.
Figure 6:
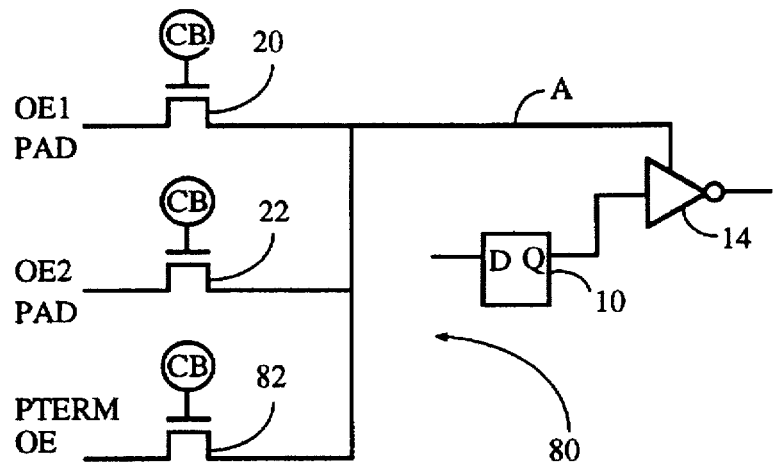
FIG. 6 shows an output enable circuit in accordance with the present invention.

FIG. 6 shows an output enable circuit 80 which replaces output enable circuit 24 of FIG. 2. In contrast to circuit 24, output enable circuit 80 (FIG. 6) includes a third input terminal which receives a private product term OE. This product term is selectively provided to node A by the activation of an additional pass transistor 82. In one embodiment, each of transistors 20, 22, and 82 is controlled by a separate configuration bit CB. In an alternative embodiment, two configuration bits are decoded to provide three different control signals for transistors 20, 22 and 82.

In the prior art of FIG. 2, two chip I/O pins provide output enable signals OE1 and OE2 for all macrocells. In accordance with the invention shown in FIG. 6, each macrocell may use one of two global output enable signals that the user initiates externally, or may use the private product term OE signal generated internally. Advantageously, if private product term OE is used to control the output enable signal, the chip pins are then free to be used as input pins.

Figure 3:
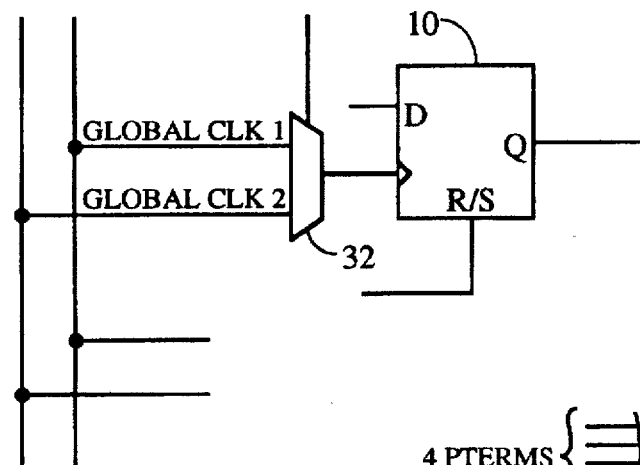
FIG. 3 shows a portion of a prior art macrocell having two global clock signal lines selectively connected to the clock terminal of the flip-flop.
Figure 4:
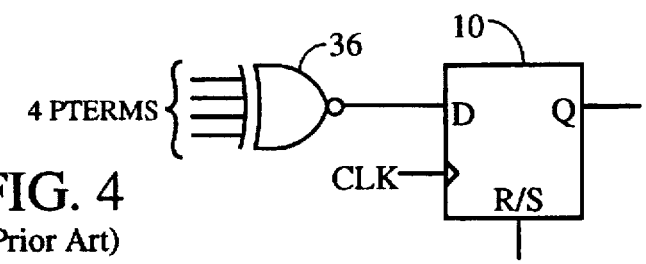
FIG. 4 shows a prior art macrocell showing provision of signals to the D input terminal of the flip-flop of the macrocell.
Figure 7:
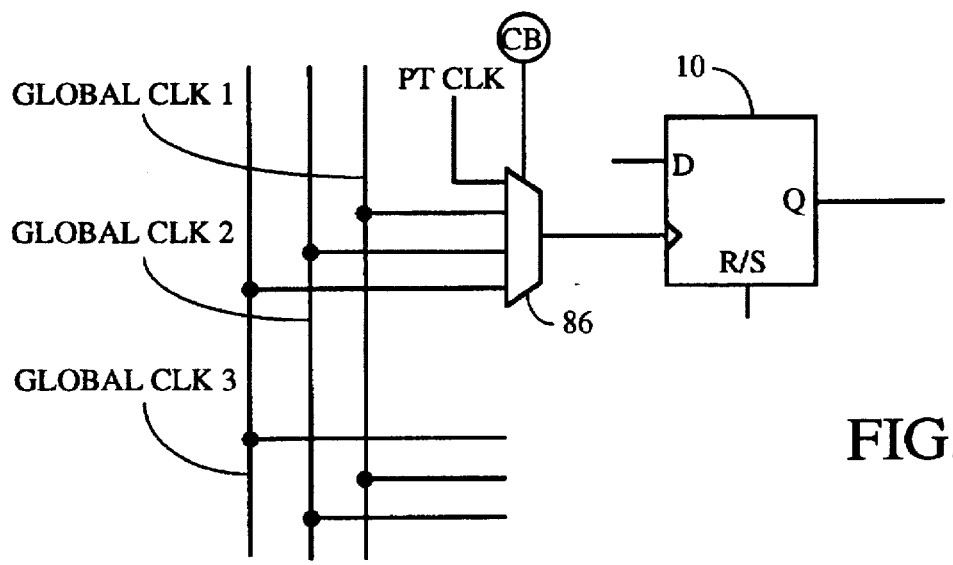
FIG. 7 shows three global clock signal lines selectively coupled to a flip-flop in accordance with the present invention.

FIG. 7 shows an improved clocking scheme over that of prior art FIG. 3 in accordance with a third aspect of the invention. In FIG. 7, there are three global clock signals instead of the two of FIG. 3. The three global clock signals are programmably connected (as shown by the programmable node dots) to multiplexer 86. A fourth input line to multiplexer 86, labeled ptclk, carries a (private) product term signal. Thus, in accordance with the present invention, there is a choice of pin clocking via the three global clock signals or the product term signal. In one embodiment, two configuration bits CB (not shown in detail), are decoded to provide control signals to multiplexer 86, thereby allowing selection from the four input clock signals to multiplexer 86.

As shown in FIG. 7, the present invention provides that each macrocell may have its own internally generated clock signal, thereby allowing the user to clock flip-flop 10 with a different frequency independent of any other macrocell which significantly increases circuit flexibility in comparison to prior art circuits. Additionally, the present invention allows the possibility of freeing up use of one or more chip pins.

Figure 8:
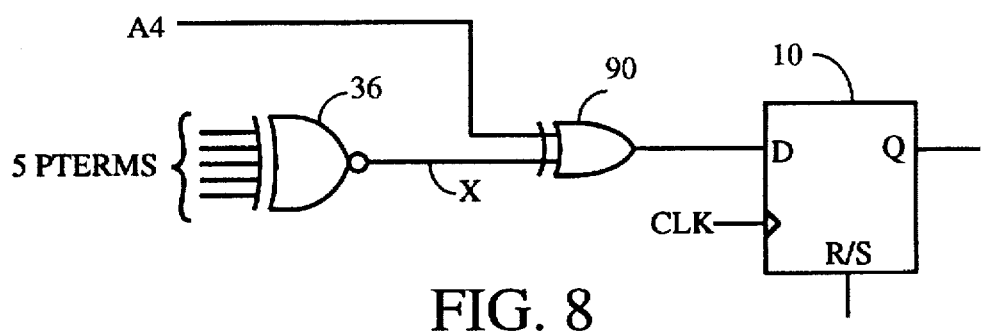
FIG. 8 shows the relationship of a plurality of data signals to the data input terminal of a flip-flop in accordance with the present invention.

In accordance with the fourth aspect of the present invention shown in FIG. 8, an additional logic gate, i.e. exclusive OR (XOR) gate 90, receives signals from NOR gate 36 as well as from one of the product term lines (designated A4 for product term inversion (ptInv)). The output terminal of XOR gate 90 is connected to the D input terminal of flip-flop 10. If the value of the product term on line A4 is zero, the signal at the D terminal is the value as determined by NOR gate 36. On the other hand, if the signal on line A4 is equal to one, then the signal at node X is exclusively ORed with that signal, thereby providing that the signal at the D input terminal of flip-flop 10 is the inverse of the signal at node X. Thus, depending on the value of the signal on line A4, the input signal to the D terminal of flip flop 10 is equal to the signal at node X or the inverse of the signal at node X, thereby providing the inversion function as described above.

This description is illustrative and not limiting; further modifications will be apparent to one skilled in the art in the light of this disclosure. Such modifications are intended to fall within the scope of the appended claims.

We claim:

1. A macrocell for a programmable logic device, the macrocell including a flip-flop having at least a data input terminal, a data output terminal, a set terminal, and a reset terminal, the macrocell comprising further:
   a first input terminal connected to receive a first product term;
   a second input terminal connected to receive a second product term;
   a third input terminal connected to receive a global set/reset signal;
   a fourth input terminal connected to receive the global set/reset signal;
   a first configurable switch connected between the first input terminal and the set terminal;
   a second configurable switch connected between the second input terminal and the reset terminal;
   a third configurable switch connected between the third input terminal and the set terminal; and
   a fourth configurable switch connected between the fourth input terminal and the reset terminal.

2. The macrocell of claim 1, wherein each configurable switch is a pass transistor having a control terminal connected to a configuration element.

3. The macrocell of claim 1, wherein each of the third and fourth input terminals are connected to an input terminal of the programmable logic device.

4. A method of operating a macrocell of a programmable logic device, the macrocell including a flip-flop having at least a data input terminal, a data output terminal, a set terminal, and a reset terminal, comprising the steps of:
   providing a selected one of a first product term signal and a global set signal to the set terminal; and
   providing a selected one of a second product term signal and a global reset signal to the reset terminal.

5. The macrocell of claim 1, the data output terminal being connected to an input terminal of an output buffer, the output buffer having a first output enable terminal and a second output enable terminal, both output enable terminals being selectably connected to an output enable node of the output buffer, and comprising a third output enable terminal selectively connected to the output enable node, the third output enable terminal being connected to receive a product term signal of the macrocell.

6. The macrocell of claim 5, wherein the third output enable terminal is selectively connected to the output enable node by a configurable pass transistor.

7. The macrocell of claim 4, the flip-flop driving an output buffer, further comprising the steps of:
   providing a first, a second and a third output enable signal, the third output enable signal being a product term signal of the macrocell; and
   selectively connecting one of the output enable signals to the output buffer.

8. The macrocell of claim 1, the flip-flop having a clock terminal, the macrocell further comprising:
   at least first and second global clock signal lines Connected to respective first and second input terminals of a multiplexer, an output terminal of the multiplexer being connected to the clock terminal of the flip-flop; and
   a product term clock signal line connected to a third input terminal of the multiplexer.

9. The macrocell of claim 8, further comprising at least two control lines connected to respective first and second control terminals of the multiplexer.

10. The method of claim 4, the flip-flop having a clock terminal further comprising the steps of:
    providing first and second global clock signals;
    providing a product term clock signal; and
    selectively connecting one of the first or second clock signals or the product term clock signal to the clock terminal.

11. The macrocell of claim 1, the macrocell including a clock terminal, and further comprising:
    an OR gate having a plurality of input terminals, each connected to a product term line of the macrocell, and having an output terminal; and
    an exclusive OR gate having two input terminals, a first input terminal being connected to the output terminal of the OR gate and a second input terminal being connected to an additional product term line of the macrocell, and the exclusive OR gate having an output terminal connected to the data input terminal of the flip-flop.

12. The method of claim 4, further comprising the steps of:
    providing a plurality N of product term input signals;
    logically ORing together N−1 of the product term input signals;
    logically exclusively ORing together the Nth product input signal and a result of the logically ORing; and
    providing a result of the logically exclusively ORing to the data input terminal.

* * * * *